(12) United States Patent
Heeb et al.

(10) Patent No.: US 12,071,341 B2
(45) Date of Patent: Aug. 27, 2024

(54) MICROSTRUCTURE AND METHOD OF PRODUCING A MICROSTRUCTURE

(71) Applicant: ams International AG, Jona (CH)

(72) Inventors: Peter Heeb, Balgach (CH); Michelle Müller, Zufikon (CH); Goran Stojanovic, Eindhoven (NL)

(73) Assignee: AMS INTERNATIONAL AG, Jona (CH)

( * ) Notice: Subject to any disclaimer, the term of this patent is extended or adjusted under 35 U.S.C. 154(b) by 247 days.

(21) Appl. No.: 17/642,449

(22) PCT Filed: Sep. 1, 2020

(86) PCT No.: PCT/EP2020/074347
§ 371 (c)(1),
(2) Date: Mar. 11, 2022

(87) PCT Pub. No.: WO2021/047959
PCT Pub. Date: Mar. 18, 2021

(65) Prior Publication Data
US 2022/0298006 A1    Sep. 22, 2022

(30) Foreign Application Priority Data
Sep. 13, 2019    (EP) .................................... 19197364

(51) Int. Cl.
*B81B 3/00*    (2006.01)
*B81C 1/00*    (2006.01)

(52) U.S. Cl.
CPC ........ *B81C 1/00158* (2013.01); *B81B 3/0072* (2013.01); *B81B 2201/0257* (2013.01); *B81B 2201/047* (2013.01); *B81B 2203/0127* (2013.01)

(58) Field of Classification Search
CPC ... B81B 3/007; B81B 2201/0257; B81B 7/02; B81B 2203/0127; B81B 3/0072;
(Continued)

(56) References Cited

U.S. PATENT DOCUMENTS

| 5,870,482 A | 2/1999 | Loeppert et al. |
| 6,987,859 B2 | 1/2006 | Loeppert et al. |

(Continued)

OTHER PUBLICATIONS

European Examination Report dated Jan. 20, 2023, EP Application No. 19197364.3, 6 pages.
(Continued)

*Primary Examiner* — Moazzam Hossain
(74) *Attorney, Agent, or Firm* — MH2 TECHNOLOGY LAW GROUP LLP

(57) ABSTRACT

A microstructure for use in a micro electro-mechanical device comprises a substrate having a top surface and a rear surface and a thin-film structure arranged at the top surface of the substrate. The thin-film structure comprises a raised portion spaced from the substrate, a lower portion of the thin-film structure, which is in mechanical contact with the substrate, at least one protruding portion, the protruding portion being hollow and having at least one sidewall and a bottom part and the protruding portion mechanically connecting the raised portion to the substrate via the bottom part, and at least one further sidewall of the thin-film structure at a distance to the at least one protruding portion, wherein the further sidewall mechanically connects the lower portion with the raised portion of the thin-film structure.

13 Claims, 6 Drawing Sheets

(58) Field of Classification Search
CPC .......... B81B 2201/047; B81B 2201/042–045; B81B 7/0032; B81B 2203/0307; B81B 2203/04; B81B 2207/07; H04R 7/02; H04R 2201/003; H04R 19/005; H04R 19/04; H04R 2207/021; H04R 7/06; H04R 23/008; H04R 31/003; H04R 7/12; H04R 2400/11; H04R 31/006
See application file for complete search history.

(56) References Cited

U.S. PATENT DOCUMENTS

| | | | |
|---|---|---|---|
| 7,951,636 B2 | 5/2011 | Lee et al. | |
| 8,198,715 B2 | 6/2012 | Laming et al. | |
| 8,482,088 B2 | 7/2013 | Laming et al. | |
| 9,521,491 B2 | 12/2016 | Inoue et al. | |
| 9,743,191 B2 | 8/2017 | Pal et al. | |
| 2002/0009821 A1* | 1/2002 | Moor | G01J 5/10 257/E31.093 |
| 2006/0006483 A1 | 1/2006 | Lee et al. | |
| 2010/0237447 A1* | 9/2010 | Laming | B81B 3/0072 257/E21.211 |
| 2015/0256915 A1 | 9/2015 | Hoekstra et al. | |
| 2016/0037263 A1 | 2/2016 | Pal et al. | |

OTHER PUBLICATIONS

International Search Report and Written Opinion in corresponding International Application No. PCT/EP2020/074347 mailed on Sep. 21, 2020, 10 pages.
Je et al., "MEMS Capacitive Microphone with Dual-Anchored Membrane †", Proceedings, 2017, vol. 1, No. 342, 5 pages.
Phan et al., "Robust Free-Standing Nano-Thin SiC Membranes Enable Direct Photolithography for MEMS Sensing Applications", Advanced Engineering Materials, 2018, vol. 20, 6 pages.
Scheeper et al., "Fabrication of a subminiature silicon condenser microphone using the sacrificial layer technique", IEEE, 1991, 4 pages.
Teh et al., "Cross-Linked PMMA as a Low-Dimensional Dielectric Sacrificial Layer", Journal of Microelectromechanical Systems, Oct. 2003, vol. 12, No. 5, 8 pages.

* cited by examiner

MICROSTRUCTURE AND METHOD OF PRODUCING A MICROSTRUCTURE

CROSS-REFERENCE TO RELATED APPLICATIONS

The present application is the national stage entry of International Patent Application No. PCT/EP2020/074374, filed on Sep. 1, 2020, and published as WO 2021/047959 A1 on Mar. 18, 2021, which claims the benefit of priority of European Patent Application No. 19197364.3, filed on Sep. 13, 2019, all of which are incorporated by reference herein in their entirety.

FIELD OF THE INVENTION

The present disclosure relates to a microstructure for use in a microelectromechanical device, an omnidirectional optical microelectromechanical microphone, a mobile device and a method for producing a microstructure.

BACKGROUND OF THE INVENTION

With respect to the technology of microelectromechanical systems (MEMS) microstructures with raised parts play a crucial role. Many sensor applications can be realized with diaphragms or cantilevers, which are fabricated by thin-film deposition. Since such elements are not firmly attached to a substrate by construction they exhibit a relatively large degree of freedom for movement. In this way they can be used, for example, as pressure, acceleration or flow sensors. Even microphone applications are possible.

However, raised parts rely on robust anchors to an underlying substrate. Usually, raised parts are anchored with the substrate by sidewalls, which are perpendicular to the surface. Imperfections along the sidewalls at convex or concave edges can degrade the mechanical stability and hence result in cracks or local stress relaxation and creep. Among others, such imperfections can include reduced sidewall thickness, bad uniformity, poor edge coverage, formation of growth boundaries, intrinsic stress or plastic strain due to load excursions.

It is an objective to provide a microstructure for use in a microelectromechanical device, which exhibits improved mechanical stability. It is further an objective to provide a method of producing a microstructure for use in a microelectromechanical device, which exhibits improved mechanical stability.

This objective is achieved with the independent claims. Further embodiments and variants derive from dependent claims. The definitions as described above also apply to the following description unless otherwise stated.

SUMMARY OF THE INVENTION

In an embodiment the microstructure comprises a substrate, which may comprise a semiconductor material, for example silicon (Si). The substrate can have a main plane of extension. The substrate has a top surface and a rear surface. The rear surface faces away from the top surface.

The microstructure further comprises a thin-film structure arranged at the top surface of the substrate. The thin-film structure may comprise a material, which is compatible with a semiconductor process, for example silicon-nitride (SiN) or polycrystalline silicon.

The thin-film structure comprises a lower portion, which is in mechanical contact with the substrate. The area of the lower portion of the thin-film structure that is in mechanical contact with the substrate forms a contact area. The contact area can have any size and shape. The contact area can be continuous or discontinuous.

The thin-film structure further comprises a raised portion spaced from the substrate. The raised portion can be arranged at the top surface of the substrate. This means that in a vertical direction the raised portion has a distance to the top surface of the substrate, where vertical directions are perpendicular to the main plane of extension of the substrate. Thus, the raised portion of the thin-film structure is not in mechanical contact with the substrate. The raised portion of the thin-film structure can extend in a plane, which is parallel to the main plane of extension of the substrate. In top-view, that means in a plane, which runs parallel to the main plane of extension of the substrate, the raised portion can have any shape. The top-view refers to a view on the microstructure from the side of the thin-film structure facing away from the substrate in a vertical direction. The distance between the raised portion of the thin-film structure and the substrate depends on the application and can differ from one application to another. In vertical directions, the raised portion and the lower portion do not overlap. In lateral directions that extend parallel to the main plane of extension of the substrate the raised portion and the lower portion are arranged adjacent to each other.

The thin-film structure comprises at least one protruding portion. The protruding portion extends in a vertical direction from the raised portion towards the top surface of the substrate. The protruding portion is formed by a part of the thin-film structure. The protruding portion is in direct contact with the raised portion. The protruding portion is in direct contact with the raised portion at a top side of the protruding portion, the top side facing away from the substrate. The protruding portion has at least one sidewall and a bottom part. The sidewall is perpendicular or transverse with respect to the main plane of extension of the substrate. The bottom part can extend parallel to the main plane of extension of the substrate. The protruding portion mechanically connects the raised portion to the substrate via the bottom part. This means that the bottom part of the protruding portion is in mechanical contact with the substrate. In top-view, the protruding portion can have any shape. The size of the protruding portion can be smaller than the size of the raised portion of the thin-film structure.

The protruding portion is hollow. This means that the protruding portion forms a hollow profile. The volume enclosed by the protruding portion is delimited by the bottom part and the at least one sidewall of the protruding portion. At the top side of the protruding portion, the enclosed volume is connected to the environment of the thin-film structure. This means, the protruding portion is open at the top side.

The thin-film structure further comprises at least one further sidewall, which mechanically connects the lower portion to the raised portion. The at least one further sidewall is arranged at a distance to the protruding portion. However, the at least one protruding portion can be arranged close to the further sidewall of the thin-film structure. The distance can be varying depending on the application. The further sidewall can be perpendicular or transverse with respect to the main plane of extension of the substrate.

The raised portion may be exclusively mechanically connected to the substrate via the lower portion and the protruding portion. The raised portion, the lower portion, the protruding portion and the further sidewall may comprise the same material. Furthermore, the raised portion may be integrally formed with the lower portion, the protruding portion and the further sidewall.

Since the raised portion is only connected to the substrate via the lower portion with the further sidewalls as well as via the protruding portion, the raised portion is a movable part of the microstructure. This means that the raised portion is capable to become deflected. The deflection of the raised portion can be in vertical directions towards the substrate and/or away from the substrate.

The limitation of mechanical stability of microstructures with raised, movable parts formed by thin-films can be improved by the proposed construction. Thereby, the construction increases the bending stiffness of the anchoring of raised movable parts, without increasing the film thickness. The increase of the bending stiffness is accomplished by integrating one or more protruding portions with hollow profiles. Characteristic to that proposed construction elements is that the geometrical moment of inertia is increased.

Due to the inherent increase of the sidewall area and edge lengths, since the protruding portion comprises at least one sidewall, local high stress levels are reduced. In case that several protruding portions are used, each protruding portion mechanically connects the raised portion to the substrate separately. As an advantage, potential damage such as delamination from the substrate does not result in a sudden complete system failure as in the case without protruding portions. For delamination or other failures of that kind, the proposed construction with a large number of protruding portions will exhibit a graceful degradation. By choice of the number of protruding portions and their geometry, the rigidity against radial and tangential acting stress can be controlled independently.

In an embodiment the further sidewall, the raised portion and the substrate enclose a cavity between the substrate and the raised portion. This means that the further sidewall surrounds the cavity in lateral directions and delimits the cavity in the lateral directions. The cavity is further delimited by the substrate on the one hand and the raised portion on the other hand. The substrate and the raised portion delimit the cavity in vertical directions.

By this arrangement the raised portion forms a diaphragm. The cavity forms a fixed volume, for example a volume of gas or air. The volume is separated from the environment of the microstructure by the diaphragm. This arrangement can be used, for example, in microphone or speaker applications. It can also be used in pressure sensing applications.

In an embodiment the microstructure comprises an opening in the substrate extending from the rear surface of the substrate towards the raised portion of the thin-film structure. The opening is formed as a trench extending within the substrate in a vertical direction. The opening can have a smaller extent in the lateral directions than the raised portion. The opening can connect the cavity, which is formed by the further sidewall, the substrate and the raised portion, to the environment at the rear surface of the substrate. The opening can have any shape. The depth of the opening in a vertical direction is given by the thickness of the substrate.

By forming an opening an access is given from the rear surface to the top surface of the substrate. In case that a cavity is present, this is the only access to the cavity, since above the top surface of the substrate the cavity is enclosed by the thin-film. An access can be important for processing reasons, for example for removing a sacrificial layer. Besides, by forming an opening the volume of the cavity enclosed by the substrate and the thin-film structure is increased. This can be important, too, for example for microphone applications, since the response of a membrane to sound waves, especially to audio frequencies, can be changed by increasing the volume. Thus, the sensitivity as well as the signal-to-noise ratio can be improved.

In an embodiment the thin-film structure comprises a diaphragm, whereas the diaphragm can be a membrane or a plate. The diaphragm can be formed by the raised structure. This means that the raised portion is surrounded by the at least one further sidewall at all lateral directions. Thus, all edges of the raised portion are connected to the lower portion via the at least one further sidewall. The thickness of the diaphragm in a vertical direction depends on the application. The arrangement of a diaphragm can be used for pressure sensing applications as well as for microphone and speaker applications.

In an embodiment the thin-film structure comprises a beam or a lever. The beam or the lever can be formed by the raised structure. This means that the thin-film structure comprises a further sidewall only at one lateral side of the raised portion. Thus, at all other lateral sides the edges of the raised portion are not connected to a lower portion via a further sidewall. The thickness of the beam or the lever in a vertical direction depends on the application. The arrangement of a beam or a lever can be used, for example, for acceleration sensing applications as well as for flow sensing applications.

In an embodiment the thin-film structure comprises a bridge. The bridge can be formed by the raised portion. This means that the thin-film structure comprises two further sidewalls at two opposing lateral sides of the raised portion. The two respective sides are not adjacent, so that the two further sidewalls are spaced apart from each other. For example, in case of a rectangular raised portion the two further sidewalls are arranged at opposite edges of the raised portion. Bridges can be used, for example, as a raised circuit path.

In an embodiment the raised portion of the thin-film structure has a circular or rectangular shape in top-view. However, the shape of the raised portion is not limited to being circular, but can have any shape, for example a poly-angular shape. The shape of the raised portion can depend on the application. A circular shape of a raised portion used as membrane, for example, can be advantageous in terms of a uniform deflection and a uniform stress distribution in lateral directions.

In an embodiment the microstructure comprises a plurality of protruding portions. The protruding portions can be arranged in places, where the raised portions can be connected to an underlying substrate via the bottom parts of the protruding portions. In case of an opening in the substrate in a region under the raised portion, no protruding portions can be arranged in this region. Thus, each protruding portion may be arranged in proximity to the further sidewall, since the extent of the opening in lateral directions may be smaller than the extent of the raised portion. The amount of protruding portions as well as the region of their placement can be varying depending on the application. The distance between two neighboring protruding portions can be same for all protruding portions. By choice of the number of protruding portions and of the region of placement, the rigidity against radial and tangential acting stress can be controlled independently.

In an embodiment the microstructure comprises a plurality of protruding portions, wherein in top-view at least two of the plurality of protruding portions have different shapes. For example, one protruding portion can have a circular shape, whereas another protruding portion can have a rectangular or elliptical shape. Also by choice of the geometry of the protruding portions, the rigidity against radial and tangential acting stress can be controlled independently.

In an embodiment the at least one protruding portion has a circular, an elliptical, a rectangular, a poly-angular or a sickle-shaped shape. The shape of the protruding portion is given for the top-view. However, the shape of the protruding portion is not limited in being one of those shapes, but can have any shape. As stated above, by choice of the geometry of the protruding portions, the rigidity against radial and tangential acting stress can be controlled independently.

In an embodiment the at least one sidewall of the protruding portion is perpendicular or transverse with respect to a main plane of extension of the substrate. The adjustment of the sidewall can impact the stability of the thin-film structure. However, the adjustment of the sidewall can also be given by the process, for example by the lithography. By implementing a slightly transverse, which means flat, sidewall, the edge coverage by the thin-film structure can be improved.

In an embodiment the at least one further sidewall of the thin-film structure is perpendicular or transverse with respect to a main plane of extension of the substrate. The adjustment of the further sidewall can impact the stability of the thin-film structure. However, the adjustment of the further sidewall can also be given by the process, for example by the lithography. By implementing a slightly transverse, which means flat, further sidewall, the edge coverage by the thin-film structure can be improved.

In an embodiment the raised portion of the thin-film structure is corrugated. This means that at least in places the raised portion has no planar surface, which is parallel to the main plane of extension of the substrate. Instead, the raised portion exhibits regions, which extend in a vertical direction. A corrugated raised portion can have improved properties in terms of deflection. The corrugation can also be caused by the fabrication process.

In a further embodiment the microstructure is incorporated in an omnidirectional optical MEMS microphone. An omnidirectional microphone is capable to respond to sound from all directions, even to sound arriving from a rear side. The microphone can further be an optical microphone. An optical microphone evaluates the response of a membrane to sound by use of an optical method. When a mirror is integrated on the membrane, vibrations can be detected by use of a laser beam and an interferometer. This way, movement of the membrane can be detected by changes in the optical path length of the reflected beam. In this arrangement there is advantageously no need for a back plate, as needed for conventional condenser microphones.

In a further embodiment the microstructure is incorporated in an omnidirectional optical MEMS microphone, which in turn is incorporated in a mobile device. The mobile device can be, for example, a smart speaker device, a smart watch, a phone or a hearing aid device. Since the microstructure is fabricated in MEMS technology the mobile device can have small dimensions.

In a further embodiment a plurality of microstructures are incorporated in an electrical device. The electrical device can be, for example, any transducer device such as a microphone, a smart speaker device, a smart watch, a phone or a hearing aid device. The plurality of microstructures can be arranged in a repeated construction, so that it forms an array of microstructures. This way, the electrical device enables array sensing.

Furthermore, a method of producing a microstructure is provided. All features disclosed for the microstructure are also disclosed for the method for producing the microstructure and vice-versa.

The method of producing a microstructure for use in a microelectromechanical device comprises providing a substrate with at least one sacrificial layer arranged in places at a top surface of the substrate. The sacrificial layer can comprise, for example, tungsten-titanium (W—Ti) and can be deposited, for example, by a sputter process. Patterning of the at least one sacrificial layer can be done by etching. Several depositions of a sacrificial layer can be conducted subsequently and after each deposition an etching process can be performed for patterning the corresponding sacrificial layer. At least one trench is formed within the at least one sacrificial layer. The trench extends towards the substrate.

A thin-film is deposited on the sacrificial layer, the trench and the substrate. The thin-film may be deposited by chemical vapor deposition (CVD) or plasma enhanced CVD (PECVD). The thin-film can be patterned by an etching process. The thin-film is in mechanical contact with the substrate in places, where no sacrificial layer is present, for example at the bottom of the trench in the sacrificial layer. Besides, the thin-film covers the side surfaces of the trench in the sacrificial layer. The thin-film also covers the edges of trench in the sacrificial layer. The thin-film also covers the top surface of the sacrificial layer, this means the surface of the sacrificial layer facing away from the substrate. Thus, the sacrificial layer is arranged between the substrate and the thin-film in places.

After the deposition of the thin-film and its patterning the sacrificial layer is removed. In this way a thin-film structure is formed from the thin-film by removing the sacrificial layer. The removal of the sacrificial layer can be done by wet etching. The removal of the sacrificial layer releases the thin-film in places. This means that in places, where the thin-filmed has been arranged on the sacrificial layer, a raised portion of the thin-film is formed after the removal of the sacrificial layer. The raised portion is formed by the part of the thin-film deposited on the sacrificial layer. A protruding portion is formed by the part of the thin-film deposited within the at least one trench in the sacrificial layer. A further sidewall is formed by the part of thin-film deposited on the side surface of the patterned sacrificial layer. After the removal of the sacrificial layer the microstructure is formed by the thin-film and the substrate.

By using a sacrificial layer raised portions of a microstructure can be produced. Processes of making raised thin-film structures are simpler and more cost-effective than equivalent structures made with processes like chemical mechanical polishing (CMP). Additionally, by adding protruding portions, which are in mechanical contact to an underlying substrate, to raised thin-film structures, the stability of the thin-film structure can be improved.

In one embodiment of the method of producing a microstructure for use in microelectromechanical device an opening in the substrate is formed. The opening can be formed by deep reactive-ion etching (DRIE). The opening extends from the rear surface of the substrate towards the raised portion of the thin-film structure. The etching process can be controlled by time or by use of an etch stop layer. In the latter case the etch stop layer has been deposited before the deposition of the sacrificial layer at the top side of the substrate in places, where the opening shall be formed. The etch stop layer may comprise chrome (Cr) and can be removed after forming the opening for example by wet etching. The lateral extent of the opening can be smaller than the lateral extent of the raised portion. In this way, protruding portions, which are arranged in a lateral direction close to the further sidewall of the thin-film structure, are still connected to the underlying substrate.

By forming an opening an access is given from the rear surface to the top surface of the substrate. An access can be important for processing reasons, for example for removing the sacrificial layer. Besides, by forming an opening the volume of a cavity enclosed by the substrate and a membrane can be increased. This means that the cavity is enlarged in a vertical direction through the opening in the substrate. This can be important, too, for example for microphone applications, since the response of a membrane to sound waves, especially to audio frequencies can be changed this way. Thus, the sensitivity as well as the signal-to-noise ratio can be improved by enlarging the cavity volume.

In an embodiment of the method of producing a microstructure for use in a microelectromechanical device the sacrificial layer is removed after forming the opening in the substrate. In embodiments comprising a diaphragm the opening can give the only access to the sacrificial layer, since above the top surface of the substrate the sacrificial layer is covered by the thin-film. The access can then be used for removing the sacrificial layer, for example by wet etching. Besides, by forming an opening the volume enclosed in a device comprising a diaphragm can be increased.

The following description of figures may further illustrate and explain exemplary embodiments. Components that are functionally identical or have an identical effect are denoted by identical references. Identical or effectively identical components might be described only with respect to the figures where they occur first. Their description is not necessarily repeated in successive figures.

DETAILED DESCRIPTION

Figure 1A:
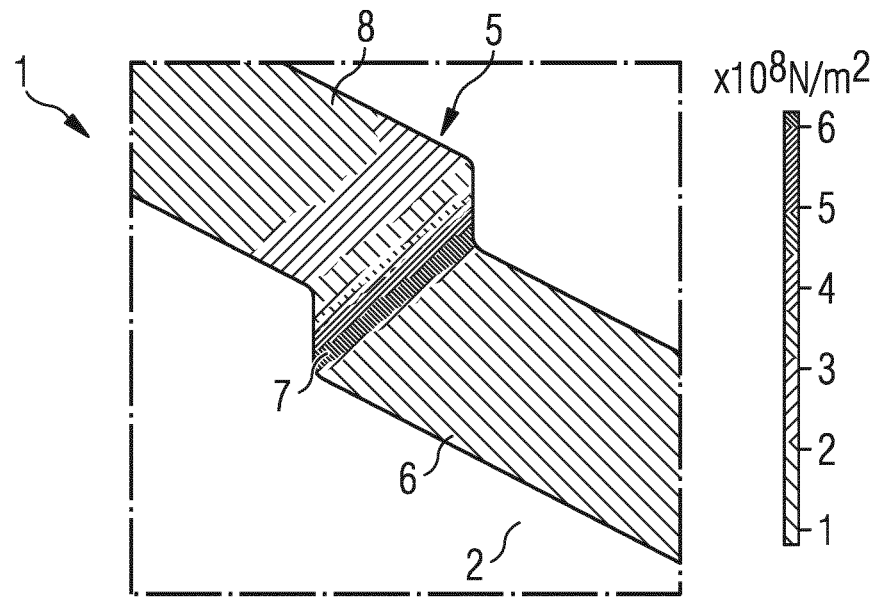
FIG. 1a shows the result of a finite element analysis (FEA) of an example for a raised microstructure.

In FIG. 1a the result of a FEA-simulation of an exemplary part of a microstructure 1, which is no embodiment, is shown. The microstructure 1 comprises a thin-film structure 5. In this figure the stress distribution (von Mises stress) of the thin-film structure 5 is evaluated. The thin-film structure 5 comprises a lower portion 6 in contact with a substrate 2, a further sidewall 7 and a raised portion 8. The lower portion 6, the further sidewall 7 and the raised portion 8 comprise the same material. The lower portion 6 and the raised portion 8 have a planar surface, which extend parallel to a main plane of extension of the substrate 2. With respect to the lower portion 6 the raised portion 8 is arranged at an elevated level. The further sidewall 7 connects the lower portion 6 to the raised portion 8. Besides, the further sidewall 7 is perpendicular to both the surface of the lower portion 6 and of the raised portion 8.

The scale gives the mechanical stress in N/m2. The stress shows high values in the region of the further sidewall 7, especially at the edge of the further sidewall 7 that is adjacent to the lower portion 6. This stress results from the production process and can also come from different coefficients of thermal expansion from the used materials. In turn, the tension can result in a bending moment on the microstructure 1 and a deflection of the raised portion 8. Due to load excursion material fatigue, plastic strain and cracks can occur.

Figure 1B:
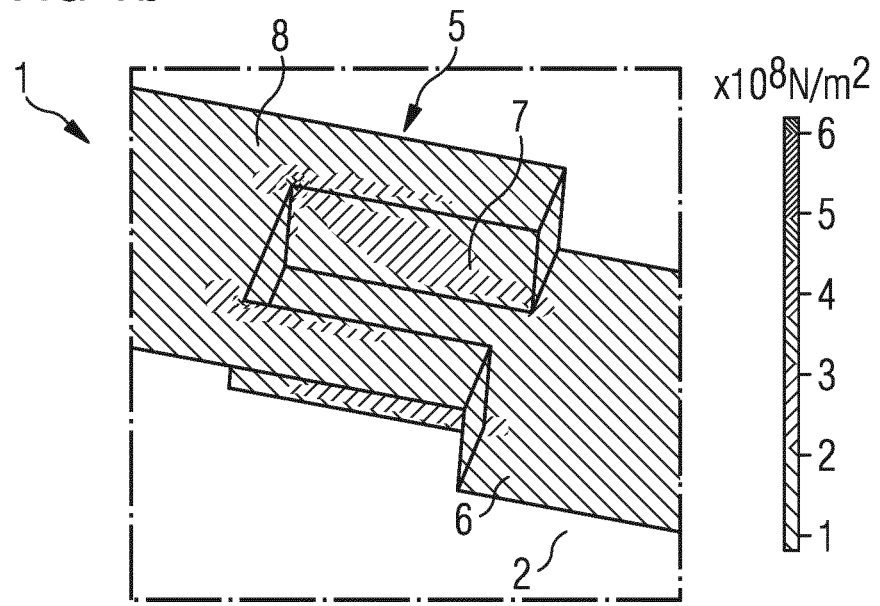
FIG. 1b shows the result of a finite element analysis (FEA) of another example for a raised microstructure.

In FIG. 1b the result of a FEA-simulation with regard to the stress distribution of another exemplary part of a microstructure 1, which is no embodiment, is shown. Also in this example the thin-film structure 5 comprises a lower portion 6 in contact with a substrate 2, a further sidewall 7 and a raised portion 8 with the same properties as described above. Additionally, the thin-film structure 5 has a corrugated further sidewall 7, as known from prior art, e.g. from the U.S. Pat. No. 6,987,859 B2. This means, the further sidewall 7 does not only extend along one direction but comprises several parts that enclose an angle of 90° with each other. Even if this layout reduces the stress within the further sidewall 7, there are local high stress levels at the top edges of the corrugations.

Figure 2:
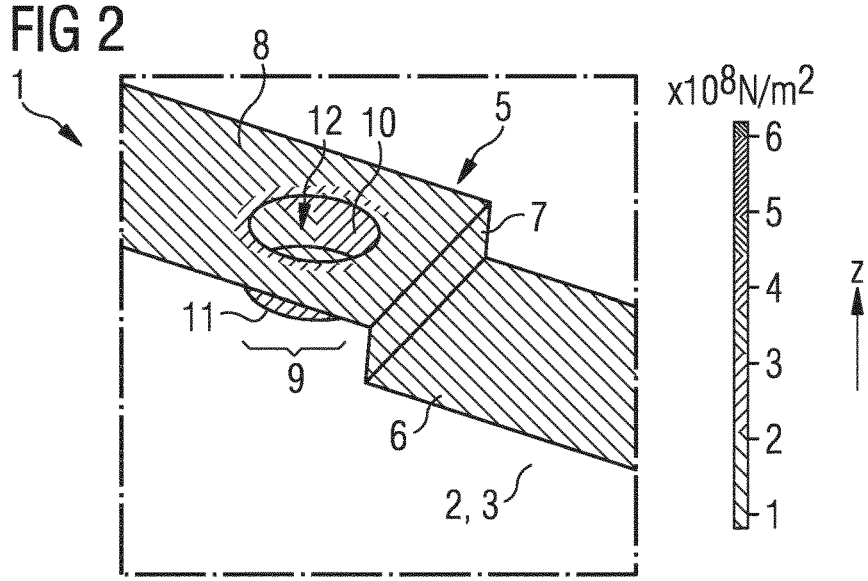
FIG. 2 shows the result of a finite element analysis (FEA) of an exemplary embodiment of a microstructure.

With FIG. 2 the FEA stress evaluation of a part of an embodiment for a microstructure 1 comprising a thin-film structure 5 is shown. Elements according to FIG. 2 that correspond to elements of the examples according to FIGS. 1a and 1b are designated with the same reference numerals.

As in the examples of FIGS. 1a and 1b the thin-film structure 5 according to FIG. 2 comprises a lower portion 6 in contact with a substrate 2, a further sidewall 7 and a raised portion 8 with the same properties as described above. This means, inter alia, that the lower portion 6, the further sidewall 7 and the raised portion 8 comprise the same material.

Only a top surface 3 of the substrate 2 is shown in FIG. 2. The substrate 2 can have a main plane of extension. The thin-film structure 5 is arranged on the top surface 3 of the substrate 2. In top-view, which means in a plane, which runs parallel to the main plane of extension of the substrate 2, the thin-film structure 5 of this embodiment has a stripe-like shape. The top-view refers to a view on the microstructure 1 from the side of the thin-film structure 5 facing away from the substrate 2.

The lower portion 6 of the thin-film structure 5 is in contact with the top surface 3 of the substrate 2. The lower portion 6 has a planar surface, which runs parallel to the main plane of extension of the substrate 2.

The lower portion 6 is connected to the further sidewall 7, which, in this embodiment, is perpendicular to the main plane of extension of the substrate 2 as well as to a main plane of extension of the lower portion 6. The lower portion 6 and the further sidewall 7 form a lower edge in the region where the lower portion 6 is connected to the further sidewall 7. The further sidewall 7 extends in a vertical direction z away from the substrate 2, where the vertical directions z are perpendicular to the main plane of extension of the substrate 2.

The raised portion 8 of the thin-film structure 5 is connected to the further sidewall 7, so that the raised portion 8 and the further sidewall 7 form an upper edge in the region where the raised portion 8 is connected to the further sidewall 7. In the embodiment shown in FIG. 2 the raised portion 8 has a planar surface, which also runs parallel to the main plane of extension of the substrate 2, but on an elevated level with respect to the lower portion 6. Thus, the raised portion 8 is spaced from the substrate 2. The raised portion 8 and the lower portion 6 do not overlap in a vertical direction z.

A protruding portion 9 is arranged within the region of the raised portion 8 of the thin-film structure 5. The protruding portion 9 comprises at least one sidewall 10, which extends in a vertical direction z from the raised portion 8 towards the substrate 2. The number of sidewalls 10 depends on the shape of the protruding portion 9. For example, in this case a cross section through the protruding portion 9 in a plane that extends parallel to the main plane of extension of the substrate 2, the protruding portion 9 has the shape of a circle. This means, the protruding portion 9 has one sidewall 10, whereas in case of a rectangular shape in the cross section the protruding portion 9 would have four sidewalls 10 corresponding to the four side surfaces.

In the embodiment of FIG. 2, the sidewall 10 is perpendicular to the main plane of extension of the substrate 2. The protruding portion 9 of this embodiment has a cylindrical shape. Thus, the protruding portion 9 comprises a bottom part 11, which in this case has a circular shape. The bottom part 11 is in mechanical contact with the substrate 2.

The protruding portion 9 forms a hollow profile, in this case a hollow cylinder. This means, the protruding portion 9 encloses a volume. At the top side of the protruding portion 9, the enclosed volume is connected to the environment of the thin-film structure 5, where the top side of the protruding portion 9 faces away from the substrate 2. This means, the protruding portion 9 is open at the top side. The raised portion 8 has an aperture 12 for the protruding portion 9.

As shown in FIG. 2, the stress distribution is significantly reduced in comparison to the examples of FIG. 1a and FIG. 1b. Thus, the proposed construction of a thin-film structure 5, in particular of a raised thin-film structure 5 including a protruding portion 9, improves the mechanical properties.

Figure 3A:
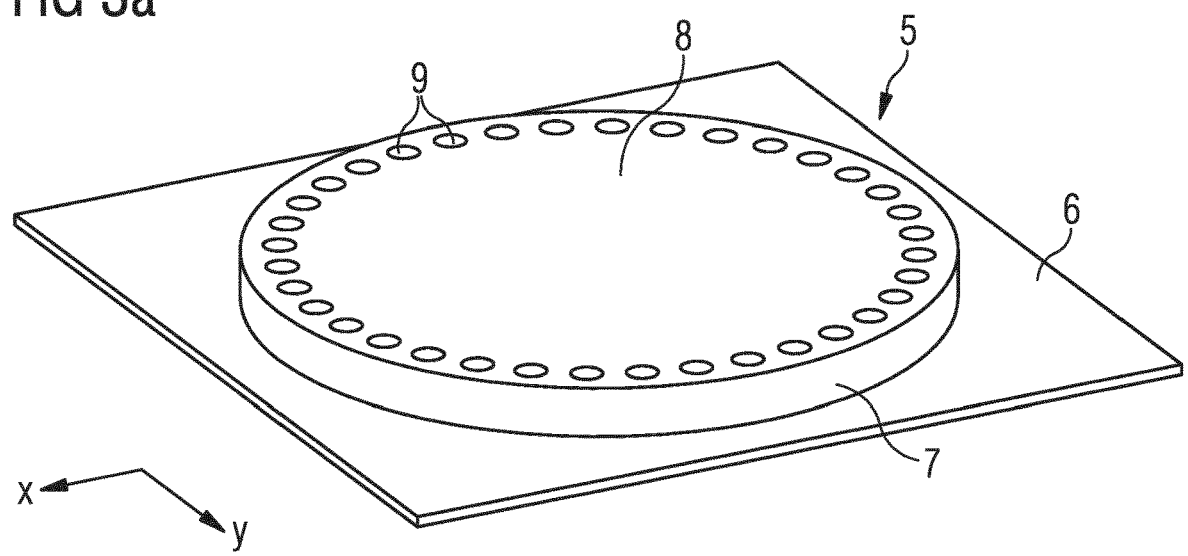
FIG. 3a shows an exemplary embodiment of a thin-film structure.

FIG. 3a shows another embodiment of the thin-film structure 5.

The thin-film structure 5 has the shape of a square in top-view. However, the raised portion 8 of the thin-film structure 5 has a circular shape in top-view. In all lateral directions x, y the raised portion 8 is connected to the lower portion 6 via a ring-shaped further sidewall 7. Close to the further sidewall 7 the raised portion 8 comprises cylindrical shaped protruding portions 9. In this embodiment the thin-film structure 5 comprises a plurality of protruding portions 9, whereas each protruding portion 9 is placed equidistantly to its neighbored protruding portions 9. This way, the plurality of protruding portions 9 forms a ring of protruding portions 9 along the periphery of the raised portion 8. This arrangement of the thin-film structure 5 forms a diaphragm. This means that the substrate 2, the further sidewall 7 and the raised portion 8 enclose a cavity 13.

Figure 3B:
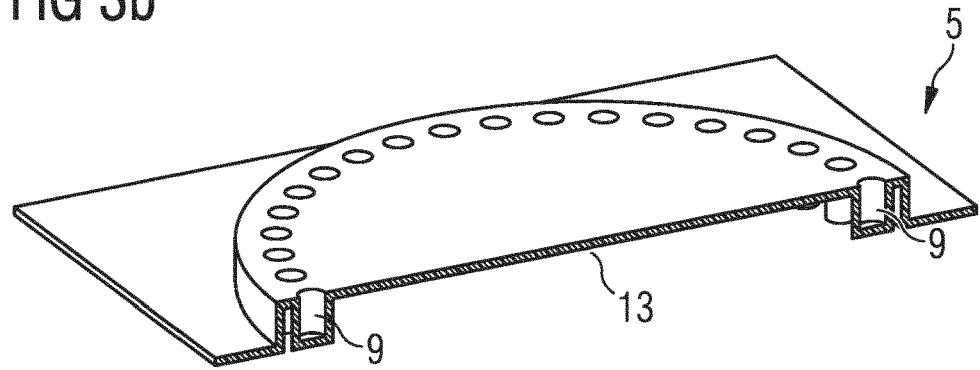
FIG. 3b shows a cut-away view through an exemplary embodiment of a thin-film structure.

With FIG. 3b a cut through the embodiment of the thin-film structure 5 of FIG. 3a is shown. On the one hand the cavity 13, which is covered by the thin-film structure 5, is shown. On the other hand also the protruding portions 9 extending towards the substrate 2, which is not shown in this representation, are visible.

Figure 4:
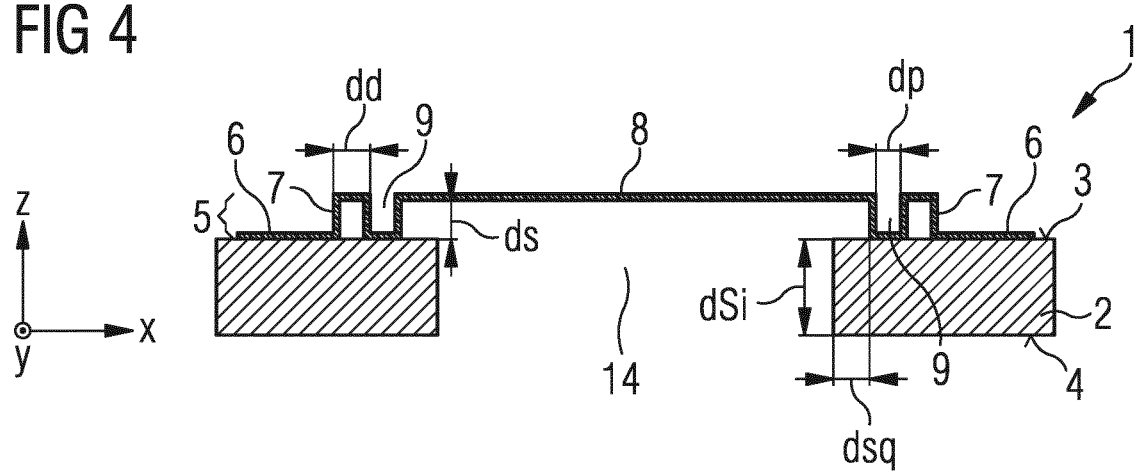
FIG. 4 shows a cross-section of an exemplary embodiment of a microstructure.

FIG. 4 shows a schematic cross-section through an embodiment of the microstructure 1.

The microstructure 1 comprises a substrate 2 with a top surface 3 and a rear surface 4. An opening 14 penetrates the substrate 2 and connects the rear surface 4 to the top surface 3. The depth dSi of the opening 14 corresponds to the thickness of the substrate 2. The depth dSi can be, for example, at least 100 micrometer and at most 750 micrometer. However, the depth dSi should be chosen as large as possible and can extend 750 micrometer and be, for example, at most 2.5 millimeter.

On the top surface 3 of the substrate 2 the thin-film structure 5 is arranged. In the cross-sectional view, the thin-film structure 5 comprises a lower portion 6 at both sides of the opening 14. The lower portion 6 is in mechanical contact with the top surface 3 of the substrate 2.

The microstructure 1 also comprises a further sidewall 7 at both sides of the opening 14 in the cross-sectional view. The height ds of the further sidewall 7 corresponds to the height of the raised portion 8 and depends on the application. The height ds of the further sidewall 7 can be at least 0.5 micrometer and at most 10 micrometer. Alternatively, the height ds of the further sidewall 7 can be at least 0.6 micrometer and at most 4 micrometer.

The microstructure 1 also comprises a raised portion 8 of the thin-film structure 5 spanning the opening 14 in the substrate 2. The diameter of the raised portion 8 from one further sidewall 7 to the other opposing further sidewall 7 depends on the application. For example, in case of a circular shaped raised portion 8 forming a diaphragm, the diameter of the raised portion 8 may be at least 100 micrometer and at most 10 millimeter. Alternatively, the diameter of the raised portion 8 may be at least 500 micrometer and at most 1 millimeter.

At a distance dd to the further sidewall 7 the microstructure 1 comprises a protruding portion 9. The distance dd between the protruding portion 9 and the further sidewall 7 depends on the application. For example, the distance dd between the protruding portion 9 and the further sidewall 7 can be at least 0.5 micrometer and at most 500 micrometer. Alternatively, the distance dd between the protruding portion 9 and the further sidewall 7 can be at least 6 micrometer and at most 20 micrometer.

The diameter dp of the protruding portion 9 in a plane that extends parallel to the main plane of extension of the substrate 2 depends on the application. For example, in case of a cylindrical protruding portion 9 the diameter dp can be at least 0.5 micrometer and at most 50 micrometer. Alternatively, the diameter dp of the protruding portion 9 can be at least 2 micrometer and at most 8 micrometer.

The raised portion 8 is integrally formed with the lower portion 6, the protruding portion 9 and the further sidewall 7. This means, the raised portion 8, the lower portion 6, the protruding portion 9 and the further sidewall 7 are formed by one layer.

According to the embodiment of FIG. 4 the opening 14 in the substrate 2 is arranged in a vertical direction z under the raised portion 8. However, the extent of the opening 14 in the substrate 2 in lateral directions x, y is smaller than the extent of the raised portion 8. This way, protruding portions 9, which are typically placed close to the further sidewall 7, can be connected to the underlying substrate 2. The protruding portion 9 can be arranged at a distance dsq from the opening 14. In case of the raised portion 8 being a membrane the distance dsq affects the damping of the membrane during vibration. Thus, the distance dsq depends on the application. For example, the distance dsq can be at least 0.5 micrometer and at most 100 micrometer. Alternatively, the distance dsq can be at least 2 micrometer and at most 8 micrometer.

Figure 5:
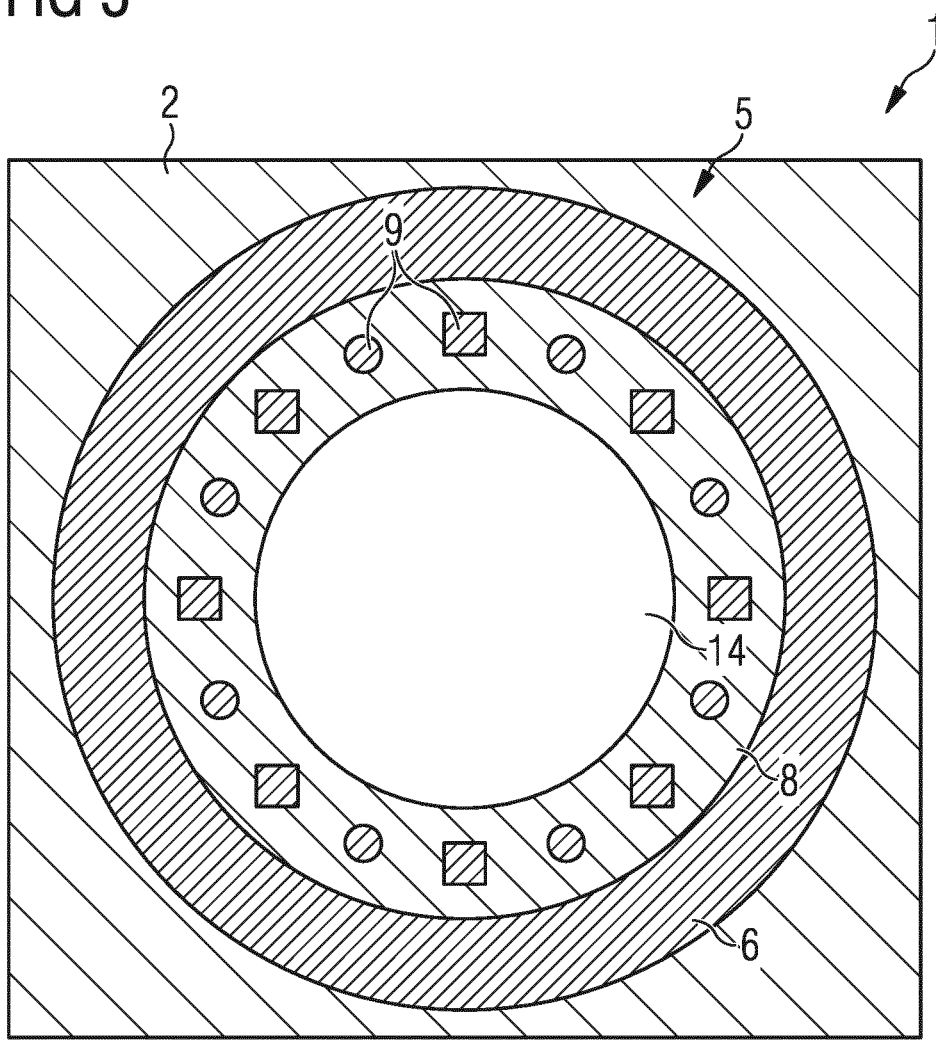
FIG. 5 shows a top-view of an exemplary embodiment of a microstructure.

FIG. 5 shows a top-view of an embodiment of a microstructure 1 comprising a raised thin-film structure 5. It should be noted that FIG. 5 can be regarded as a top-view of the embodiment of FIG. 4.

The embodiment according to FIG. 5 comprises, in top-view, a square-shaped substrate 2 with a circular shaped opening 14 in the center of the substrate 2. Additionally, the embodiment comprises a circular shaped thin-film structure 5 on top of the substrate 2. The thin-film structure 5 comprises a ring-shaped lower portion 6 in contact with the substrate 2. The ring-shaped lower portion 6 surrounds the entire thin-film structure 5.

The raised portion 8 forms an inner circular area of the thin-film structure 5. In particular, the raised portion 8 forms a circle, which concentrically overlaps the opening 14 in the substrate 2.

Additionally, the embodiment of FIG. 5 shows a plurality of protruding portions 9 arranged around the opening 14. In this embodiment, the shapes of the protruding portions 9 vary by being circular or rectangular-shaped in top-view, respectively.

Figure 6:
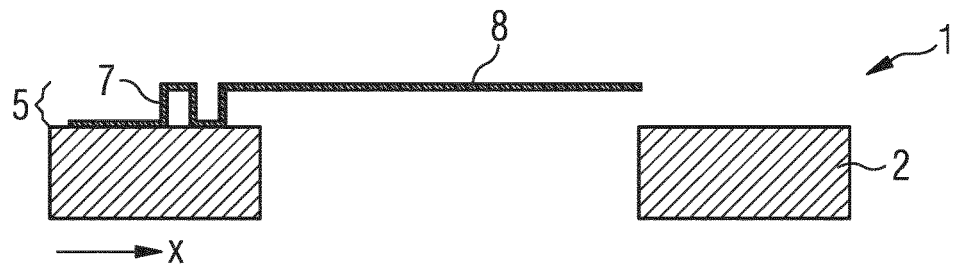
FIG. 6 shows a cross-section of another exemplary embodiment of a microstructure.
Figure 7:
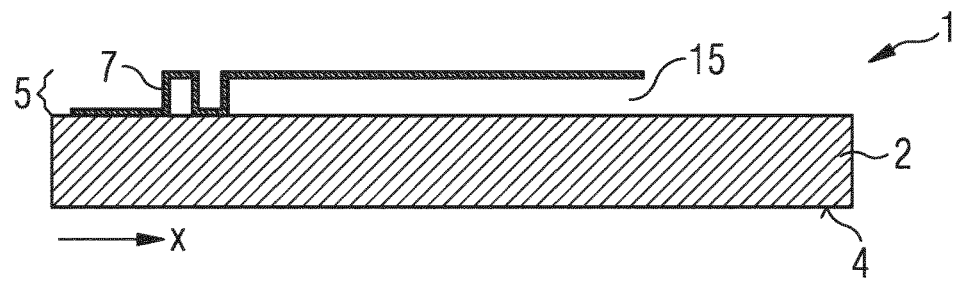
FIG. 7 shows a cross-section of another exemplary embodiment of a microstructure.
Figure 8:
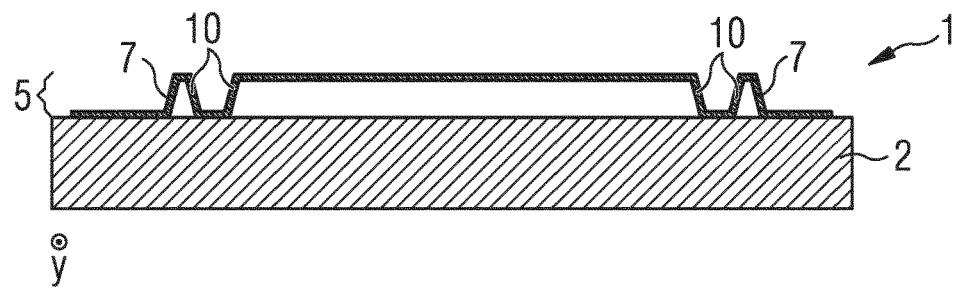
FIG. 8 shows a cross-section of another exemplary embodiment of a microstructure.

FIGS. 6, 7 and 8 show cross-sectional views of other exemplary embodiments of the microstructure 1.

The embodiment according to FIG. 6 differs from the embodiment according to FIG. 4 in the absence of a further sidewall 7 at one side of the raised portion 8 in a lateral direction x. The further sidewall 7 is arranged at only one side of the raised portion 8. Thus, the thin-film structure 5 shown in FIG. 6 can be regarded as a lever or a beam.

The embodiment according to FIG. 7 differs from the embodiment according to FIG. 6 in the absence of an opening 14 in the substrate 2. Since raised thin-film structures 5 are usually fabricated by use of a sacrificial layer, the sacrificial layer has to be removed at some point of the process. When, as in this embodiment, no opening 14 in the substrate 2 is provided, there is no access to the sacrificial layer from the rear surface 4 of the substrate 2. In this case, the sacrificial layer can be removed via wet-etching trough vents 15 in the thin-film structure 5. For example, these vents 15 are formed by regions without a further sidewall 7 of the thin-film structure 5. Such a region is given in this embodiment at one side of the raised portion 8 in the lateral direction x.

The embodiment according to FIG. 8 differs from the embodiment according to FIG. 4 in the absence of an opening 14 in the substrate 2. The thin-film structure 5 shown in FIG. 8 can be regarded as a bridge over the substrate 2. As stated above, the sacrificial layer can be removed via wet-etching trough vents 15 in the thin-film structure 5, for example vents 15 in a lateral direction y. Besides, the embodiment shows both sidewalls 10 and further sidewalls 7 to be transverse with respect to the main plane of extension of the substrate 2.

Figure 9:
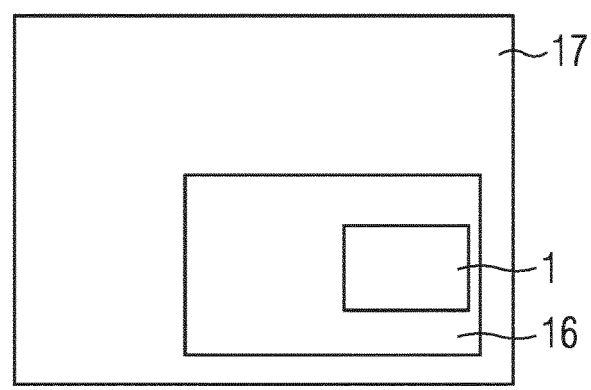
FIG. 9 shows a schematic diagram of an exemplary embodiment of a mobile device comprising a MEMS microphone, the MEMS microphone comprising the microstructure.

FIG. 9 shows a schematic diagram of an exemplary embodiment of a mobile device 17, comprising an omnidirectional optical MEMS microphone 16, which in turn comprises a microstructure 1 as discussed above. The mobile device 17 can be, for example, a smart speaker device, a smart watch, a phone or a hearing aid device.

With FIGS. 10a to 10i an exemplary embodiment of a method of producing a microstructure 1 is shown. The method relates to the fabrication of a membrane for use in an omnidirectional optical MEMS microphone 16.

Figure 10A:
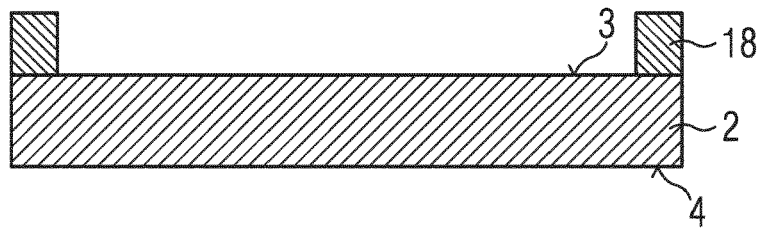
In FIGS. 10a to 10i an exemplary embodiment of a method of producing a microstructure is shown.

The method comprises providing a substrate 2, as shown in FIG. 10a. The substrate 2 has a rear surface 4 and a top surface 3. The substrate 2 can comprise Si. On the top surface 3 of the substrate 2 a dielectric layer 18 is arranged in places. The dielectric layer 18 can comprise, for example, silicon-oxide ($SiO_2$). However, a part of the top surface 3 of the substrate 2 is free of the dielectric layer 18, so that the dielectric layer 18 forms an aperture towards the substrate 2.

Figure 10B:
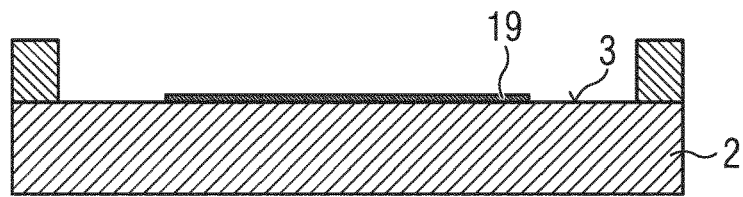

In a next step an etch stop layer 19 is deposited on the top surface 3 of the substrate 2 in places (FIG. 10b). The etch stop layer 19 may comprise Cr. The etch stop layer 19 is arranged in a central region of the aperture formed by the dielectric layer 18. The etch stop layer 19 is provided for forming an opening 14 in the substrate 2 as described below.

Figure 10C:
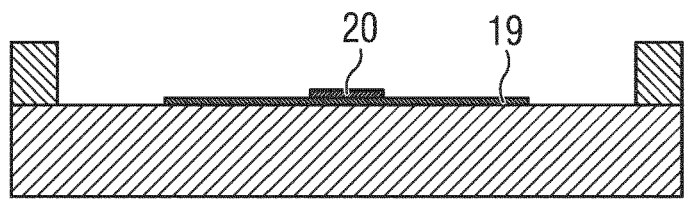

In a next step a reflective layer 20 is deposited in a central region on top of the etch stop layer 19 (FIG. 10c). The reflective layer 20 may comprise gold (Au) or titanium (Ti). The reflective layer 20 has a rear surface facing the etch stop layer 19, a top surface facing away from the substrate 2 and side surfaces. The reflective layer 20 is provided as a mirror, which at the end of the process is attached to the membrane. By using the mirror the deflection of the membrane can be evaluated optically. This means that a laser beam, which is reflected at the mirror, can be analyzed by use of an interferometer.

Figure 10D:
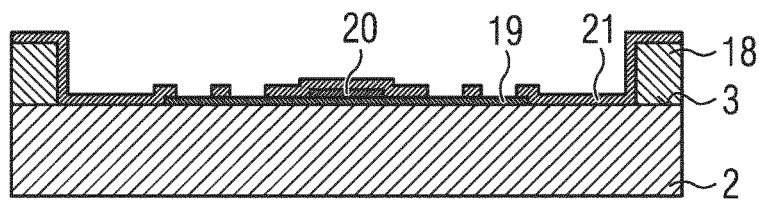

FIG. 10d shows the deposition of a first sacrificial layer 21. The first sacrificial layer 21 may comprise W—Ti. The first sacrificial layer 21 is deposited on the dielectric layer 18, the top surface 3 of the substrate 2, the etch stop layer 19 and the reflective layer 20. By a patterning step the first sacrificial layer 21 is removed on parts of the etch stop layer 19 to release the etch stop layer 19. The patterning of the first sacrificial layer 21 is provided to achieve a corrugated second sacrificial layer, which in turn leads to a corrugated membrane as described below.

Figure 10E:
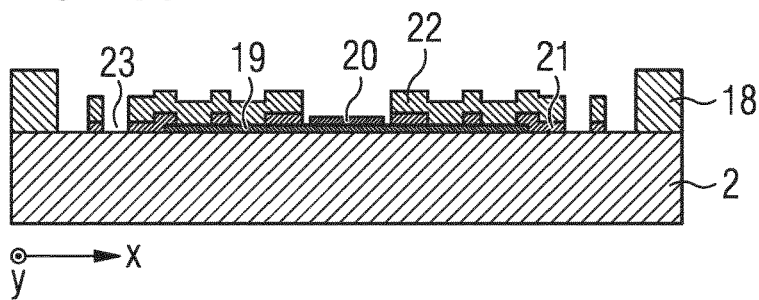

FIG. 10e shows the deposition of the second sacrificial layer 22 on top of the first sacrificial layer 21 and on the released parts of the etch stop layer 19. The second sacrificial layer 22 may also comprise W—Ti. Because of the underlying topography the second sacrificial layer 22 has a corrugated top surface. This means that in places the second sacrificial layer 22 has no planar surface, which is parallel to the main plane of extension of the substrate 2. Instead, the second sacrificial layer 22 exhibits regions, which extend in a vertical direction z.

In a patterning process both sacrificial layers 21, 22 are removed on the dielectric layer 18. The sacrificial layers 21, 22 are also removed in regions adjacent to the dielectric layer 18 in lateral directions x, y in order to release the substrate 2. The sacrificial layers 21, 22 are also removed on a central region above the reflective layer 20 in order to release the reflective layer 20. This way, the reflective layer 20 is free of the sacrificial layers 21, 22 at its top surface as well as at its side surfaces.

Besides, one or more trenches 23 are formed within the stack of sacrificial layers 21, 22 in places where no etch stop layer 19 is present underneath. The trenches 23 extend towards the substrate 2 in order to release the substrate 2. The trenches 23 are provided to form protruding portions 9 of the thin-film structure 5 after the complete removal of the sacrificial layers 21, 22.

Figure 10F:
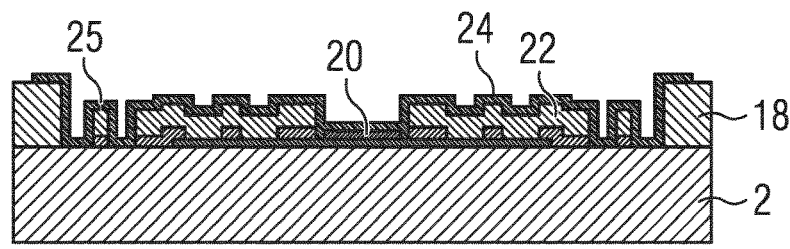

In a next step a thin-film 24 is deposited on the dielectric layer 18, the released substrate 2, the second sacrificial layer 22 and the reflective layer 20 (FIG. 10f). The thin-film may comprise SiN. The thin-film is removed on parts of the dielectric layer 18 in order to form a thin-film structure 5 of a desired shape. Besides, a vent hole 25 can be implemented by removing the thin-film in a small region above the second sacrificial layer 22.

Figure 10G:
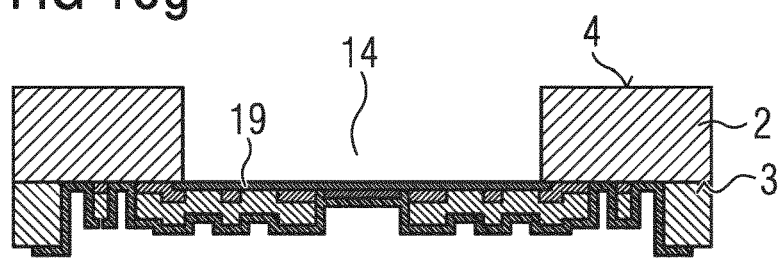

In order to form an opening 14 the substrate 2 must be turned around and back-side treated (FIG. 10g). An opening 14 is formed from the rear surface 4 to the top surface 3 of the substrate 2 in the region of the etch stop layer 19. However, the lateral extent of the opening 14 may be smaller than the lateral extent of the etch stop layer 19.

Figure 10H:
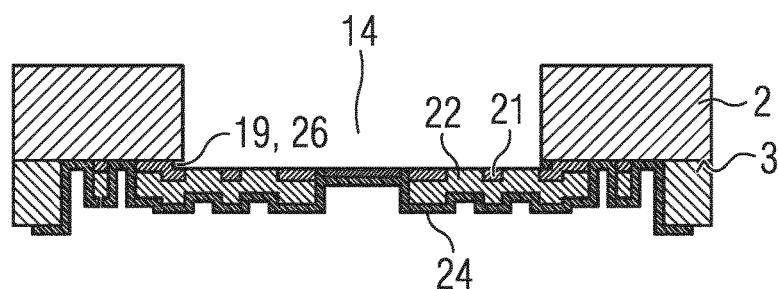

In FIG. 10h the removal of the etch stop layer 19 is shown. Since the lateral extent of the opening 14 is smaller than the lateral extent of the etch stop layer 19 a small amount of the etch stop layer 19 remains at the edges on the top surface 3 of the substrate 2. This remaining etch stop layer 19 can be used as a damping structure 26 for the vibrating membrane.

In the next step the sacrificial layers 21, 22 are removed and the device can be turned around for possible further front-side treatment. The thin-film structure 5 forms a membrane for use in an omnidirectional optical MEMS microphone 16.

The resulting microstructure 1 (FIG. 10i) is similar to the embodiment of FIG. 4. The microstructure 1 differs from the embodiment of FIG. 4 in the following:

A dielectric layer 18 is arranged around the opening 14 in the substrate 2 at a distance to the opening 14. The thin-film structure 5 comprises a portion which covers a part of the top surface of the dielectric layer 18 and the side surface of the dielectric layer 18, which points in lateral directions x, y towards the opening 14.

The lower portion 6 of the thin-film structure 5, which is in mechanical contact with the substrate 2, is arranged in a region adjacent to the dielectric layer 18 in lateral directions x, y towards the opening 14. The lower portion 6 is connected with the portion of the thin-film structure 5, which covers the side surface of the dielectric layer 18.

The raised portion 8 of the thin-film structure 5 is corrugated. This means that the raised portion 8 is not planar, but has both regions, which are parallel, and regions, which are perpendicular to the main plane of extension of the substrate 2.

Additionally, the raised portion 8 of the thin-film structure 5 comprises a central region, where the reflective layer 20 is attached to the raised portion 8. The reflective layer 20 is attached on the side of the raised portion 8, which faces the opening 14 in the substrate 2. This means that the rear surface of the reflective layer 20 is free of other layers. The top surface as well as the side surfaces of the reflective layer 20 are covered by the thin-film structure 5.

The raised portion 8 of the thin-film structure 5 also comprises a vent hole 25 in a small region at the periphery of the raised portion 8. The vent hole 25 is provided for a gas exchange from one side of the thin-film structure 5 to the other. This can be necessary since due to the membrane deflection the change of gas density can affect the system compliance. Thus, the vent hole provides pressure equalization between both sides of the thin-film structure. Additionally, the vent hole affects the frequency range of the device. In order to achieve a high acoustic resistance the diameter of the vent hole should be small.

Besides, the microstructure 1 comprises a damping structure 26 due to the remaining etch stop layer 19. The damping structure 26 is arranged at the edges of the opening 14 on the top side of the substrate 2. The damping structure 26 provides a protection from strong deflection of the membrane.

Figure 10I:
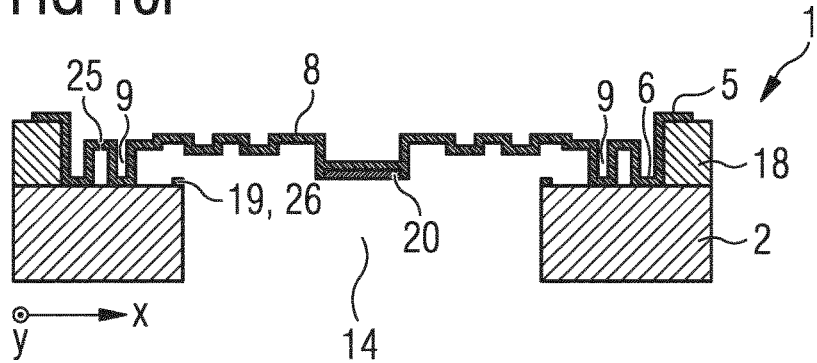

However, as in the embodiment of FIG. 4, the embodiment of FIG. 10i comprises protruding portions 9. The protruding portions 9 are formed by the part of the thin-film deposited within the trenches 23 in the sacrificial layers 21, 22. The protruding portions 9 give the membrane additional stability, since they connect the raised portion 8 to the substrate 2 and inherently increase the sidewall area.

The embodiments disclosed herein have been discussed for the purpose of familiarizing the reader with novel aspects of the idea. Although preferred embodiments have been shown and described, many changes, modifications, equivalents and substitutions of the disclosed concepts may be made by one having skill in the art without unnecessarily departing from the scope of the claims.

It will be appreciated that the disclosure is not limited to the disclosed embodiments and to what has been particularly shown and described hereinabove. Rather, features recited in separate dependent claims or in the description may advantageously be combined. Furthermore, the scope of the disclosure includes those variations and modifications, which will be apparent to those skilled in the art and fall within the scope of the appended claims.

The term "comprising", insofar it was used in the claims or in the description, does not exclude other elements or steps of a corresponding feature or procedure. In case that the terms "a" or "an" were used in conjunction with features, they do not exclude a plurality of such features. Moreover, any reference signs in the claims should not be construed as limiting the scope.

The invention claimed is:

1. A microstructure for use in a microelectromechanical device comprising a substrate having a top surface and a rear surface and a thin-film structure arranged at the top surface of the substrate, the thin-film structure comprising:
   a raised portion spaced from the substrate wherein the raised portion of the thin-film structure is a movable part of the microstructure,
   a lower portion of the thin-film structure, which is in mechanical contact with the substrate,
   at least one protruding portion being hollow and having at least one sidewall and a bottom part and the protruding portion mechanically connecting the raised portion to the substrate via the bottom part, wherein the at least one protruding portion forms a hollow profile enclosing a volume and being open at its top side, the top side facing away from the substrate, and
   at least one further sidewall of the thin-film structure at a distance to the at least one protruding portion, wherein the further sidewall mechanically connects the lower portion with the raised portion of the thin-film structure.

2. The microstructure according to claim 1, wherein the further sidewall, the raised portion and the substrate enclose a cavity between the substrate and the raised portion.

3. The microstructure according to claim 1, further comprising:
   an opening in the substrate, extending from the rear surface of the substrate towards the raised portion of the thin-film structure.

4. The microstructure according to claim 1, wherein the thin-film structure is one element of the group comprising a diaphragm, a beam, a lever and a bridge.

5. The microstructure according to claim 1, wherein in top-view the raised portion of the thin-film structure has a circular or rectangular shape.

6. The microstructure according to claim 1, wherein the thin-film structure comprises a plurality of protruding portions.

7. The microstructure according to claim 6, wherein in top-view at least two of the plurality of protruding portions have different shapes.

8. The microstructure according to claim 1, wherein in top-view the at least one protruding portion has a circular, elliptical, rectangular, poly-angular or sickle-shaped shape.

9. The microstructure according to claim 1, wherein the at least one sidewall of the protruding portion and/or the at least one further sidewall of the thin-film structure are perpendicular or transverse with respect to a main plane of extension of the substrate.

10. The microstructure according to claim 1, wherein the raised portion of the thin-film structure is corrugated.

11. An omnidirectional optical microelectromechanical microphone comprising the microstructure according to claim 1.

12. A mobile device comprising the omnidirectional optical microelectromechanical microphone according to claim 11.

13. A mobile device comprising the microstructure according to claim 1.

* * * * *